(12) United States Patent
Cheng et al.

(10) Patent No.: US 10,109,666 B2
(45) Date of Patent: Oct. 23, 2018

(54) PAD STRUCTURE FOR BACKSIDE ILLUMINATED (BSI) IMAGE SENSORS

(71) Applicant: Taiwan Semiconductor Manufacturing Co., Ltd., Hsin-Chu (TW)

(72) Inventors: Ching-Hung Cheng, Zhubei (TW); Kai-Fung Chang, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/442,096

(22) Filed: Feb. 24, 2017

(65) Prior Publication Data

US 2017/0301715 A1    Oct. 19, 2017

Related U.S. Application Data

(60) Provisional application No. 62/321,839, filed on Apr. 13, 2016.

(51) Int. Cl.
*H01L 31/00*    (2006.01)
*H01L 27/146*    (2006.01)

(52) U.S. Cl.
CPC .... *H01L 27/14632* (2013.01); *H01L 27/1464* (2013.01); *H01L 27/14621* (2013.01); *H01L 27/14627* (2013.01); *H01L 27/14636* (2013.01); *H01L 27/14645* (2013.01); *H01L 27/14687* (2013.01)

(58) Field of Classification Search
CPC ......... H01L 27/14632; H01L 27/14645; H01L 27/14627; H01L 27/14621; H01L 27/1464; H01L 27/14636; H01L 27/14687
USPC .......................................................... 257/459
See application file for complete search history.

(56) References Cited

U.S. PATENT DOCUMENTS

| 6,255,586 | B1 * | 7/2001 | Kim ........................ H01L 24/03 174/538 |
| 6,297,563 | B1 * | 10/2001 | Yamaha ................... H01L 24/03 257/750 |
| 6,872,584 | B2 | 3/2005 | Nakashiba |
| 7,023,090 | B2 * | 4/2006 | Huang ................ H01L 23/5329 257/756 |
| 7,101,726 | B2 | 9/2006 | Yamamoto et al. |
| 7,675,101 | B2 | 3/2010 | Hwang |
| 7,714,403 | B2 | 5/2010 | Lee et al. |

(Continued)

*Primary Examiner* — Mohammad M Hoque
(74) *Attorney, Agent, or Firm* — Eschweiler & Potashnik, LLC

(57) ABSTRACT

A pad structure with a contact via array for high bond structure is provided. In some embodiments, a semiconductor substrate comprises a pad opening. An interconnect structure is under the semiconductor substrate, and comprises an interlayer dielectric (ILD) layer, a wiring layer, and the contact via array. The wiring layer and the contact via array are in the ILD layer. Further, the contact via array borders the wiring layer and is between the wiring layer and the semiconductor substrate. A pad covers the contact via array in the pad opening, and protrudes into the ILD layer to contact the wiring layer on opposite sides of the contact via array. A method for manufacturing the pad structure, as well as an image sensor with the pad structure, are also provided.

20 Claims, 12 Drawing Sheets

(56) References Cited

U.S. PATENT DOCUMENTS

| | | | |
|---|---|---|---|
| 7,741,716 B1* | 6/2010 | Venkitachalam | H01L 24/05 257/758 |
| 8,519,459 B2* | 8/2013 | Horiike | H01L 27/14623 257/294 |
| 8,569,856 B2* | 10/2013 | Qian | H01L 27/14636 257/437 |
| 8,610,277 B2* | 12/2013 | Chang | H01L 24/03 257/724 |
| 8,947,566 B2* | 2/2015 | Kobayashi | H01L 27/14632 257/292 |
| 9,536,810 B1 | 1/2017 | Chiang et al. | |
| 2003/0181029 A1 | 9/2003 | Nin | |
| 2005/0093176 A1* | 5/2005 | Hung | H01L 24/05 257/786 |
| 2009/0185060 A1* | 7/2009 | Akiyama | H01L 27/14623 348/294 |
| 2009/0280596 A1* | 11/2009 | Akiyama | H01L 21/76898 438/70 |
| 2010/0155949 A1* | 6/2010 | Jain | H01L 21/76838 257/751 |
| 2010/0200898 A1* | 8/2010 | Lin | H01L 27/14618 257/294 |
| 2011/0024866 A1 | 2/2011 | Tseng et al. | |
| 2011/0102657 A1 | 5/2011 | Takahashi et al. | |
| 2011/0156260 A1* | 6/2011 | Huang | H01L 23/3171 257/765 |
| 2011/0278735 A1 | 11/2011 | Yen et al. | |
| 2012/0038020 A1* | 2/2012 | Lin | H01L 21/6835 257/503 |
| 2013/0328147 A1 | 12/2013 | Ho et al. | |
| 2014/0308772 A1* | 10/2014 | Lin | H01L 27/14621 438/65 |
| 2015/0340400 A1* | 11/2015 | Takemoto | H01L 27/14634 257/448 |

* cited by examiner

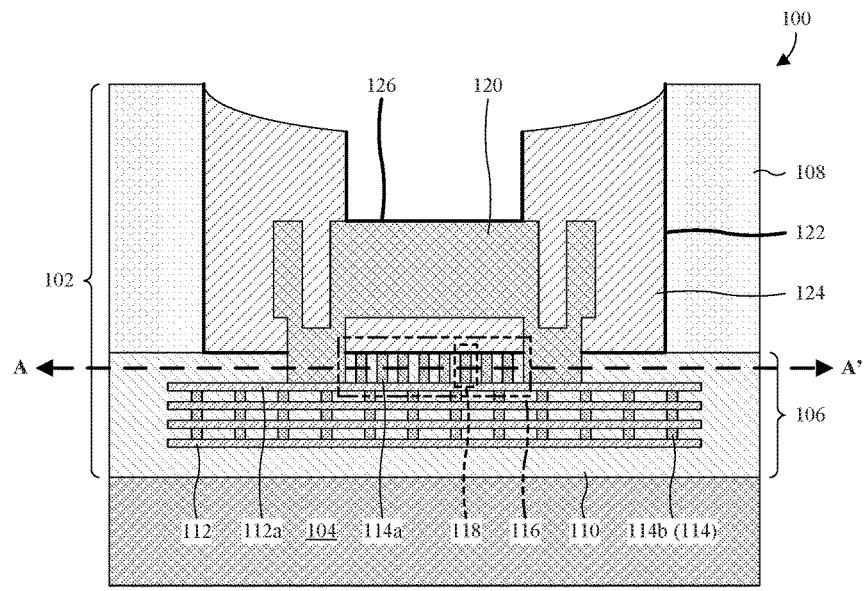
Fig. 1
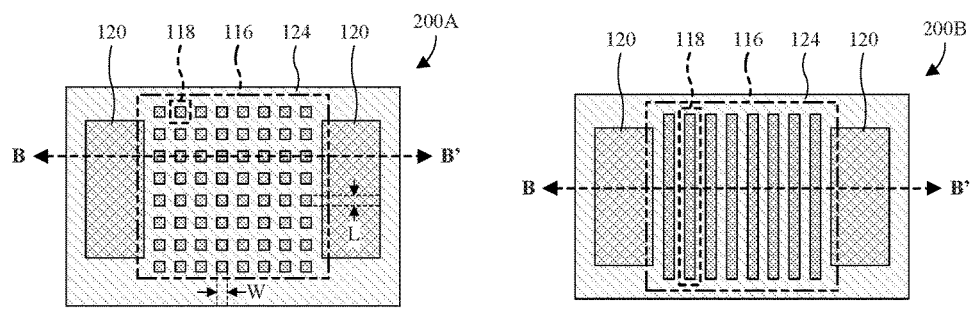
Fig. 2A  Fig. 2B

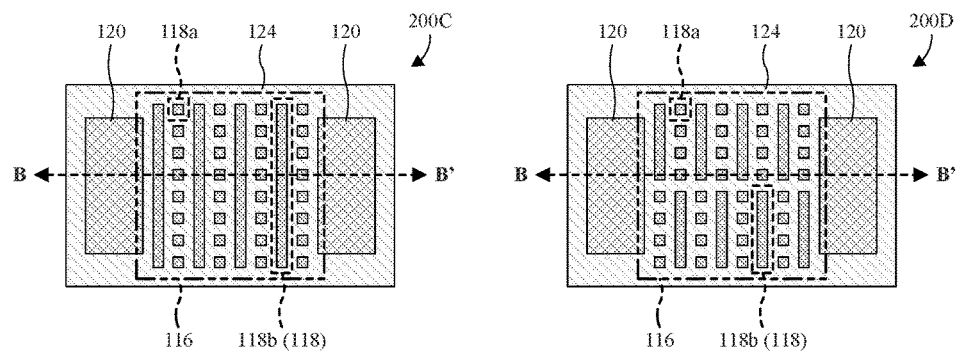
Fig. 2C  Fig. 2D
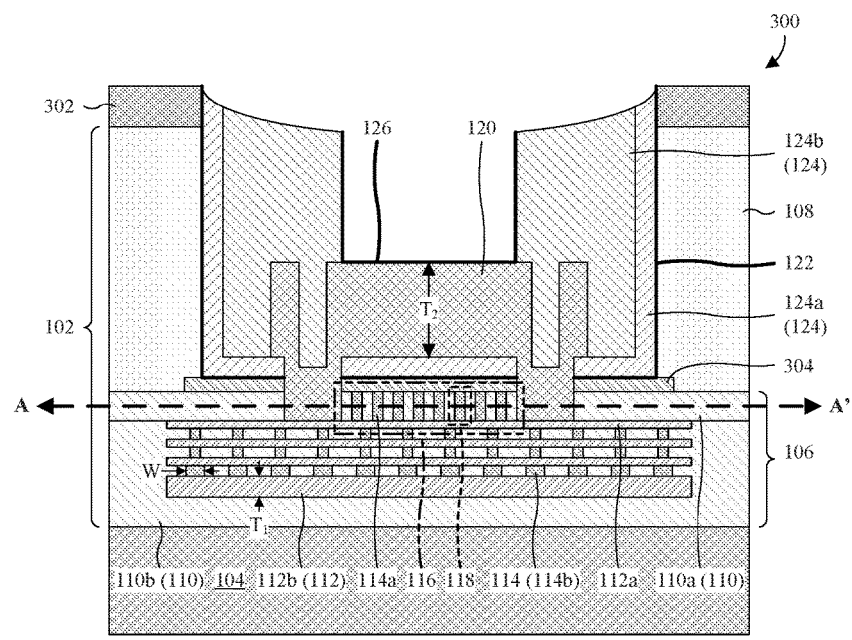
Fig. 3

PAD STRUCTURE FOR BACKSIDE ILLUMINATED (BSI) IMAGE SENSORS

REFERENCE TO RELATED APPLICATION

This application claims the benefit of U.S. Provisional Application No. 62/321,839, filed on Apr. 13, 2016, the contents of which are incorporated by reference in their entirety.

BACKGROUND

Many modern day electronic devices include complementary metal-oxide-semiconductor (CMOS) image sensors that convert optical images to digital data representing the optical images. One type of CMOS image sensor commonly used in electronic devices is a backside illuminated (BSI) image sensor. A BSI image sensor comprises an array of photodetectors overlying an interconnect structure and configured to receive radiation on an opposite side as the interconnect structure. This arrangement allows radiation to impinge on the photodetectors unobstructed by conductive features in the interconnect structure, such that the BSI image sensor has high sensitivity to incident radiation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 illustrates a cross-sectional view of some embodiments of a pad structure.

FIGS. 2A-2D illustrate layout views of various embodiments of a contact via array in the pad structure of FIG. 1.

FIG. 3 illustrates a cross-sectional view of some more detailed embodiments of the pad structure of FIG. 1.

DETAILED DESCRIPTION

Figure 4:
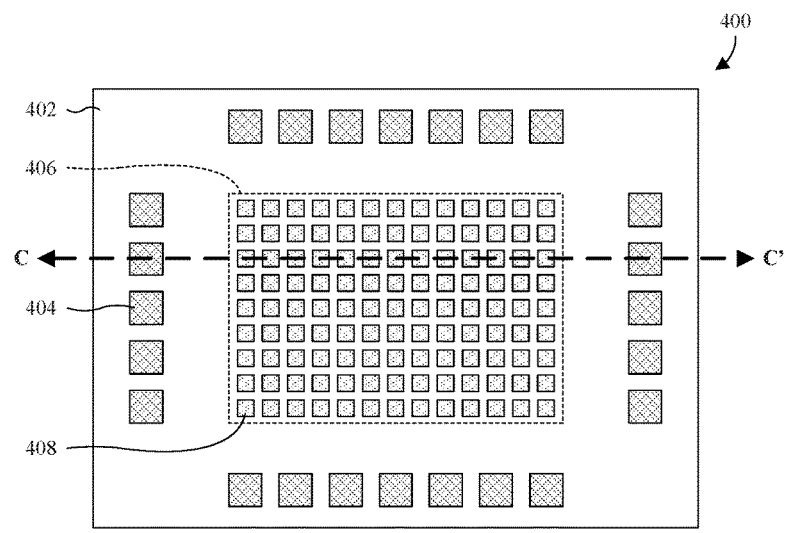
FIG. 4 illustrates a layout view of some embodiments of a backside illuminated (BSI) image sensor with the pad structure of FIG. 1 or 3.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", and the like, may be used herein for ease of description to describe one element or feature's relationship to another element(s) or feature(s) as illustrated in the figures. The spatially relative terms are intended to encompass different orientations of the device or apparatus in use or operation in addition to the orientation depicted in the figures. The device or apparatus may be otherwise oriented (rotated 90 degrees or at other orientations) and the spatially relative descriptors used herein may likewise be interpreted accordingly. Even more, the terms "first", "second", "third", "fourth", and the like are merely generic identifiers and, as such, may be interchanged in various embodiments. For example, while an element (e.g., an etch, a dielectric layer, or a substrate) may be referred to as a "first" element in some embodiments, the element may be referred to as a "second" element in other embodiments.

A backside illuminated (BSI) image sensor may comprise a pixel sensor array and a pad. The pixel sensor array is on a first side of a semiconductor substrate that adjoins an interconnect structure, and is configured to receive radiation from a second side of the semiconductor substrate that is opposite the first side. The interconnect structure comprises an interlayer dielectric (ILD) layer, as well as vias and wiring layers alternatingly stacked with the vias in the ILD layer. The pad is in a first pad opening of the semiconductor substrate that is spaced from the pixel sensor array and that is lined by a liner dielectric layer. Further, the pad protrudes through the liner dielectric layer to contact the ILD layer and a first wiring layer in the interconnect structure, and is partially covered by a filler dielectric layer. The filler dielectric layer fills the first pad opening over the pad and comprises a second pad opening exposing the pad from the second side of the semiconductor substrate.

A challenge with the foregoing BSI image sensor is that the pad poorly bonds to the ILD layer and the first wiring layer, such that the pad has a high likelihood of peeling, cracking, or otherwise failing in response to stress. The stress may, for example, be external stress caused by pulling on a wire bond or other structure secured to the pad, or by applying shear force to a bump (e.g., a micro bump or a gold stud bump) or other structure secured to the pad. Such pulling or shear force may, for example, result from moving or bumping the BSI image sensor. Alternatively, the stress may, for example, be internal stress caused by materials with different coefficients of thermals expansion and/or different lattice constants.

In view of the foregoing, various embodiments of the present application are directed towards a pad structure with high bond strength, as well as a method for manufacturing the pad structure. In some embodiments, a semiconductor substrate comprises a pad opening. An interconnect structure is under the semiconductor substrate, and comprises an ILD layer, a wiring layer, and contact vias. The wiring layer and the contact vias are in the ILD layer, and the contact vias are further between the wiring layer and the semiconductor substrate. The contact vias comprises a contact via array directly under the pad opening. A pad covers the contact via array in the pad opening, and protrudes into the ILD layer to contact the ILD layer and the wiring layer on opposite sides of the contact via array.

Advantageously, the contact via array shares and releases bonding stress associated with the pad, such that the pad has high bond strength and a low likelihood of peeling. For example, the contact via array resists deformation of the ILD layer and/or the wiring layer caused by the application of stress (e.g., pulling or shear force) to the pad. By resisting such deformation, the stress on bonds between the pad and the ILD layer and between the pad and the wiring layer is low and bond strength is high. Additionally, because the contact via array is made up of contact vias, the contact via array may be integrated into an integrated circuit (IC) and manufactured without additional process steps and/or masks.

With reference to FIG. 1, a cross-sectional view 100 of some embodiments of a pad structure is provided. The pad structure may, for example, be employed within a BSI image sensor. As illustrated, an IC die 102 is arranged over and bonded to a support structure 104. In some embodiments, the support structure 104 is a carrier substrate, such as, for example, a bulk semiconductor substrate (e.g., a bulk silicon substrate). In other embodiments, the support structure 104 is another IC die having a frontside bonded to the IC die 102. The IC die 102 comprises an interconnect structure 106 and a semiconductor substrate 108.

The interconnect structure 106 is between the semiconductor substrate 108 and the support structure 104, and comprises an ILD layer 110, a plurality of wiring layers 112, and a plurality of vias 114. For ease of illustration, only one of the wiring layers 112 is labeled 112 and only one of the vias 114 is labeled 114. The ILD layer 110 may be, for example, silicon dioxide, silicon nitride, a low κ dielectric (e.g., fluorosilicate glass (FSG)), some other dielectric, or a combination of the foregoing. A low κ dielectric is a dielectric with a dielectric constant κ less than that of silicon dioxide or less than about 3.9.

The wiring layers 112 are a conductive material, such as, for example, aluminum copper or copper, and the vias 114 are a conductive material, such as, for example, copper or tungsten. Further, the vias 114 are alternatingly stacked with the wiring layers 112 in the ILD layer 110, and comprise a plurality of contact vias 114a and a plurality of inter-wire vias 114b. For ease of illustration, only one of the contact vias 114a is labeled 114a, and only one of the inter-wire vias 114b is labeled 114b. The inter-wire vias 114b are between the wiring layers 112 to electrically couple the wiring layers 112 together. The contact vias 114a are between the semiconductor substrate 108 and a first wiring layer 112a nearest the semiconductor substrate 108, and electrically couple the first wiring layer 112a to semiconductor devices (not shown) in the semiconductor substrate 108. The contact vias 114a comprises a contact via array 116.

The contact via array 116 is made up of a plurality of array contact vias 118. For ease of illustration, only one of the array contact vias 118 is labeled 118. Further, in some embodiments, the contact via array 116 is electrically isolated from the semiconductor substrate 108 and/or semiconductor devices in the semiconductor substrate 108, such that the contact via array 116 is not used for electrically coupling the first wiring layer 112a to semiconductor devices in the semiconductor substrate 108. In such embodiments, the contact via array 116 may be referred to as a "dummy" contact via array. As described hereafter, the contact via array 116 is used for sharing and minimizing bonding stress associated with a pad 120.

The semiconductor substrate 108 comprises a first pad opening 122 that directly overlies the contact via array 116 and within which a pad dielectric layer 124 and the pad 120 are arranged. The pad dielectric layer 124 surrounds the pad 120, such that the pad dielectric layer 124 partially covers the pad dielectric layer 124 and is partially covered by the pad 120. Further, the pad dielectric layer 124 comprises a second pad opening 126 exposing a top surface of the pad 120. The pad 120 protrudes downward into the ILD layer 110 on opposite sides of the contact via array 116, and contacts the ILD layer 110 and the first wiring layer 112a on the opposite sides of the contact via array 116. Further, the pad 120 is configured to bond to a wire or a conductive bump (e.g., a solder ball, a gold stud bump, or a micro bump) and is conductive. For example, the pad 120 may be aluminum copper, copper, aluminum, some other conductive material, or a combination of the foregoing.

Advantageously, because the contact via array 116 directly underlies the pad 120, the contact via array 116 resists deformation of the ILD layer 110, the first wiring layer 112a, and the pad dielectric layer 124 in response to application of stress (e.g., pulling or shear force) to the pad 120. As such, the contact via array 116 absorbs and releases at least some of the stress on bonds (i.e., bonding stress) associated with the pad 120. For example, at least some of the bonding stress between the pad 120 and the ILD layer 110 is absorbed and released. As another example, at least some of the bonding stress between the pad 120 and the first wiring layer 112a is absorbed and released. As yet another example, at least some of the bonding stress between the pad 120 and the pad dielectric layer 124 is absorbed and released. By absorbing and releasing bonding stress, the contact via array 116 advantageously promotes high bonding strength, such that the pad 120 has a low likelihood of peeling.

With reference to FIGS. 2A-2D, layout views 200A-200D of various embodiments of the contact via array 116 of FIG. 1 are provided. The layout views 200A-200D may, for example, be taken along line A-A' in FIG. 1, and/or the cross-sectional view 100 of FIG. 1 may, for example, be taken along line B-B' in FIGS. 2A-2D. It is to be understood that the layout views 200A-200D are merely examples, such that the contact via array 116 may take on other layouts not shown and/or described with regard to FIGS. 2A-2D.

As illustrated by the layout view 200A of FIG. 2A, the pad 120 is arranged on opposite sides of the contact via array 116, and the array contact vias 118 making up the contact via array 116 are arranged in N rows and M columns. N and M are integer values greater than 0, and are the same or different. For example, N and M may both be 6, 8, or 10, or N and M may respectively be 5 and 10, 6 and 8, or 10 and 4. Further, the array contact vias 118 are island-type vias each having a footprint comprising a width W and a length L that are substantially the same. In some embodiments, the footprint is square, rectangular, circular, triangular, oval, or some other two dimensional (2D) shape. Further, in some embodiments, the array contact vias 118 have the same footprint or a mix of different footprints. As used herein, a footprint of a contact via is a 2D projection of the contact via onto a top surface of the first wiring layer 112a in FIG. 1.

As illustrated by the layout view 200B of FIG. 2B, a variant of FIG. 2A is provided in which the array contact vias 118 making up the contact via array 116 are slot-type vias each having a footprint that is laterally elongated. In some embodiments, the footprint is laterally elongated in a direction that is substantially perpendicular to line B-B'. In some of such embodiments, the array contact vias 118 are limited to a single row (i.e., N=1). In other embodiments, the footprint is laterally elongated in a direction that is substantially parallel to line B-B'. In some of such embodiments, the array contact vias 118 are limited to a single column (i.e., M=1). Further, in some embodiments, the array contact vias 118 have the same footprint or a mix of different footprints.

As illustrated by the layout view 200C of FIG. 2C, a variant of FIG. 2A is provided in which the array contact vias 118 making up the contact via array 116 comprise island-type vias 118a and slot-type vias 118b. In some embodiments, the contact via array 116 alternate between the island-type vias 118a and the slot-type vias 118b in a direction that is substantially parallel to line B-B'. Further, in some of such embodiments, the slot-type vias 118b each span multiple or all rows of the contact via array 116. In other embodiments, rows of the contact via array 116 alternate between the island-type vias 118a and the slot-type vias 118b in a direction that is substantially perpendicular to line B-B'. Further, in some of such other embodiments, the slot-type vias 118b each span multiple or all columns of the contact via array 116.

As illustrated by the layout view 200D of FIG. 2D, a variant of FIG. 2C is provided in which columns of the contact via array 116 alternate between the island-type vias 118a and the slot-type vias 118b in a direction that is substantially parallel to line B-B', and in which rows of the contact via array 116 also alternate between the island-type vias 118a and the slot-type vias 118b in a direction that is substantially perpendicular to line B-B'. In some embodiments, the slot-type vias 118b are laterally elongated in a direction that is substantially perpendicular to line B-B'. Further, in some of such embodiments, each column alternates between multiple island-type vias (e.g., 4 island-type vias) and slot-type vias. In other embodiments, the array contact vias 118 are laterally elongated in a direction that is substantially parallel to line B-B'. Further, in some of such embodiments, each row alternates between multiple island-type vias (e.g., 4 island-type vias) and slot-type vias.

With reference to FIG. 3, a cross-sectional view 300 of some more detailed embodiments of the pad structure of FIG. 1 is provided. As illustrated, the ILD layer 110 comprises a first ILD layer 110a and a second ILD layer 110b. The first ILD layer 110a is between the first wiring layer 112a and the semiconductor substrate 108, and accommodates the contact via array 116. The second ILD layer 110b is between the first ILD layer 110a and the support structure 104, and accommodates the wiring layers 112 and the inter-wire vias 114b. The first and second ILD layers 110a, 110b may be, for example, the same or different materials, and/or may each be silicon dioxide, a low κ dielectric, some other dielectric, or a combination of the foregoing.

In some embodiments, thicknesses $T_1$ of the wiring layers 112 increase from the first wiring layer 112a to a last wiring layer 112b, which is farthest from the semiconductor substrate 108. For example, wiring layers over the last wiring layer 112b may share a first thickness that is less than a second thickness of the last wiring layer 112b. Similarly, in some embodiments, individual widths W of the vias 114 increase from the semiconductor substrate 108 to the last wiring layer 112b. For example, vias (not individually labeled) overlying a second to the last wiring layer (not labeled) may share a first width, and vias (not individually labeled) underlying the second to the last wiring layer may share a second width that is greater than the first width.

Also illustrated by the cross-sectional view 300 of FIG. 3, the semiconductor substrate 108 is covered by a passivation layer 302, which may be, for example, silicon dioxide, silicon nitride, some other dielectric, or a combination of the foregoing. Further, the first pad opening 122 extends through the passivation layer 302, into the semiconductor substrate 108, to a bottom of the semiconductor substrate 108. In some embodiments, a bottom of the first pad opening 122 is defined by an electrical-isolation region 304 between the semiconductor substrate 108 and the first ILD layer 110a. The electrical-isolation region 304 may be, for example, a shallow trench isolation (STI) region, an implant isolation region, a deep trench isolation (DTI) region, or some other isolation region, and/or may, for example, be configured to electrically isolate the contact via array 116 from the semiconductor substrate 108.

The pad dielectric layer 124 and the pad 120 are in the first pad opening 122, and the pad dielectric layer 124 comprises a liner dielectric layer 124a and a filler dielectric layer 124b. The liner dielectric layer 124a lines sidewalls of the first pad opening 122, and further lines a bottom of the first pad opening 122 under the pad 120. The filler dielectric layer 124b fills a remainder of the first pad opening 122 over the pad 120 and the liner dielectric layer 124a, and further comprises the second pad opening 126 exposing the pad 120. The liner dielectric layer 124a and the filler dielectric layer 124b are the same or differential dielectric materials and may be, for example, silicon dioxide, silicon nitride, some other dielectric, or a combination of the foregoing. Further, in some embodiments, the pad 120 comprises a thickness $T_2$ over the liner dielectric layer 124a. The thickness $T_2$ may be, for example, greater than about 6 kilo angstroms (kA), greater than about 12 kA, between about 8-16 kA, or between about 10-14 kA.

With reference to FIG. 4, a layout view 400 of some embodiments of a BSI image sensor 402 is provided. As illustrated, the BSI image sensor 402 comprises a plurality of pad structures 404 each configured as shown in FIG. 1 or 3. For ease of illustration, only one of the pad structures 404 is labeled as 404. Further, the pad structures 404 are arranged along a periphery of the BSI image sensor 402 and laterally surround a pixel sensor array 406. For example, the pad structures 404 may be arranged in a ring.

The pixel sensor array 406 is made up of a plurality of pixel sensors 408 arranged in X rows and Y columns. X and Y are integer values greater than zero and may be, for example, the same or different. For example, X and Y may both be 128, 256, 512, 1024, or 2048, or X and Y may respectively be 768 and 1024, 1024 and 2048, 256 and 1024, or 512 and 128. For ease of illustration, only one of the pixel sensors 408 is labeled 408. The pixel sensors 408 are configured to sense incident radiation and may be, for example, active pixel sensors (APSs). In some embodiments, the APSs each comprise a photodetector and a plurality of transistors, such as, for example, a source-follower transistor, a transfer transistor, a reset transistor, a row select transistor, or a combination of the foregoing.

Figure 5:
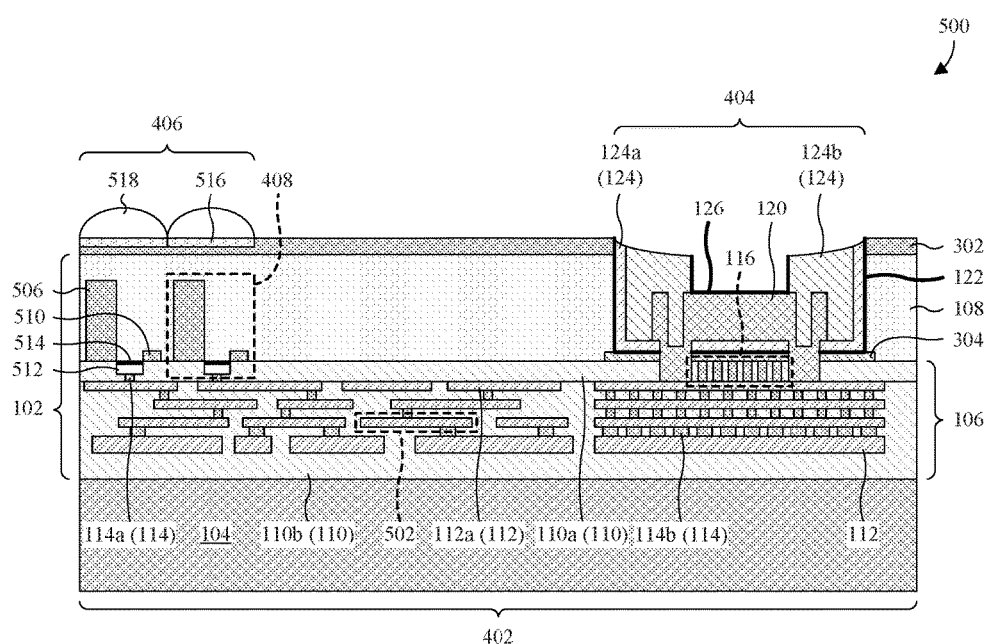
FIG. 5 illustrates a cross-sectional view of some embodiments of the BSI image sensor of FIG. 4.

With reference to FIG. 5, a cross-sectional view 500 of some embodiments of the BSI image sensor 402 of FIG. 4 is provided. The cross-sectional view 500 may, for example, be taken along a portion of line C-C' in FIG. 4. As illustrated, an IC die 102 is arranged over and bonded to a support structure 104. The IC die 102 comprises an interconnect structure 106 and a semiconductor substrate 108. The interconnect structure 106 is between the semiconductor substrate 108 and the support structure 104, and comprises an ILD layer 110, a plurality of wiring layers 112, and a plurality of vias 114. For ease of illustration, only two of the wiring layers 112 are labeled 112 and only two of the vias 114 are labeled 114.

The ILD layer 110 comprises a first ILD layer 110a bordering the semiconductor substrate 108, and further comprise a second ILD layer 110b between the first ILD layer 110a and the support structure 104. In some embodiments, the ILD layer 110 is silicon dioxide, silicon nitride, a low κ dielectric, some other dielectric, or a combination of the foregoing. The wiring layers 112 are alternatingly stacked with the vias 114 in the ILD layer 110, and are each made up of a plurality of wires 502. For ease of illustration, only one of the wires 502 is labeled 502. The vias 114 comprise a plurality of inter-wire vias 114b and a plurality of contact vias 114a. For ease of illustration, only one of the inter-wire vias 114b is labeled 114b, and only one of the contact vias 114a is labeled 114a. The wiring layers 112 are a conductive material, such as, for example, aluminum copper, copper, aluminum, some other conductive material, or a combination of the foregoing, and the vias 114 are a conductive material, such as, for example, copper, tungsten, some other conductive material, or a combination of the foregoing.

The inter-wire vias 114b are in the second ILD layer 110b, between the wiring layers 112, and electrically couple the wiring layers 112 together. The contact vias 114a are in the first ILD layer 110a, between the semiconductor substrate 108 and a first wiring layer 112a nearest the semiconductor substrate 108. Further, the contact vias 114a electrically couples the first wiring layer 112a to a pixel sensor array 406 in the semiconductor substrate 108, and comprises a contact via array 116. The contact via array 116 is electrically isolated from the semiconductor substrate 108, and advantageously shares and minimizes bonding stress associated with a pad 120. Further, the contact via array 116 may, for example, be configured according to one of the layouts of FIGS. 2A-2D or according to some other layout.

The pixel sensor array 406 is made up of a plurality of pixel sensors 408, each comprising a photodetector 506. For ease of illustration, only one of the pixel sensors 408 is labeled 408. Further, in some embodiments, the pixel sensors 408 each comprise a floating diffusion node (FDN) 510 selectively coupled to the photodetector 506 by a gate electrode 512 spaced from the semiconductor substrate 108 by a gate dielectric layer 514. The photodetector 506 and the FDN 510 are doped regions of the semiconductor substrate 108 having the same doping type, which is opposite a doping type of surrounding regions of the semiconductor substrate 108. For example, the photodetector 506 and the FDN 510 may be p-type doped regions of the semiconductor substrate 108, whereas a bulk of the semiconductor substrate 108 may be an n-type doping. As another example, the photodetector 506 and the FDN 510 may be n-type and the bulk of the semiconductor substrate 108 may be p-type.

A passivation layer 302 covers the semiconductor substrate 108, and accommodates color filters 516 respectively covering the pixel sensors 408. The color filters 516 are configured to pass assigned wavelengths of radiation, while blocking unassigned wavelengths of radiation. For example, a color filter may be configured to pass red wavelengths of radiation, while blocking blue wavelengths of radiation, whereas another color filter may be configured to pass blue wavelengths of radiation, while blocking red wavelengths of radiation. In some embodiments, the color filters 516 are respectively covered by microlenses 518 configured to focus incident radiation on respective photodetectors of the pixel sensors 408. For ease of illustration, only one of the color filters 516 is labeled 516, and only one of the microlenses 518 is labeled 518.

A first pad opening 122 is laterally spaced from the pixel sensor array 406, and defined by the passivation layer 302 and the semiconductor substrate 108. Further, in some embodiments, a bottom of the first pad opening 122 is defined by an electrical-isolation region 304 (e.g., an STI region) between the semiconductor substrate 108 and the first ILD layer 110a. The first pad opening 122 accommodates a pad dielectric layer 124 and the pad 120 directly over the contact via array 116. The pad dielectric layer 124 comprises a liner dielectric layer 124a and a filler dielectric layer 124b. The liner dielectric layer 124a lines sidewalls of the first pad opening 122, and further lines a bottom of the first pad opening 122 under the pad 120. The filler dielectric layer 124b fills a remainder of the first pad opening 122 over the pad 120 and the liner dielectric layer 124a, and comprises a second pad opening 126 exposing the pad 120. The pad 120 protrudes downward into the first ILD layer 110a, and contacts the first ILD layer 110a and the first wiring layer 112a on opposite sides of the contact via array 116.

As above, because the pad 120 directly overlies the contact via array 116, the contact via array 116 absorbs and releases at least some of the bonding stress associated with the pad 120. For example, at least some of the bonding stress between the pad 120 and the ILD layer 110 is absorbed and released. Accordingly, the contact via array 116 promotes high bonding strength, such that the pad 120 has a low likelihood of peeling.

Figure 6:
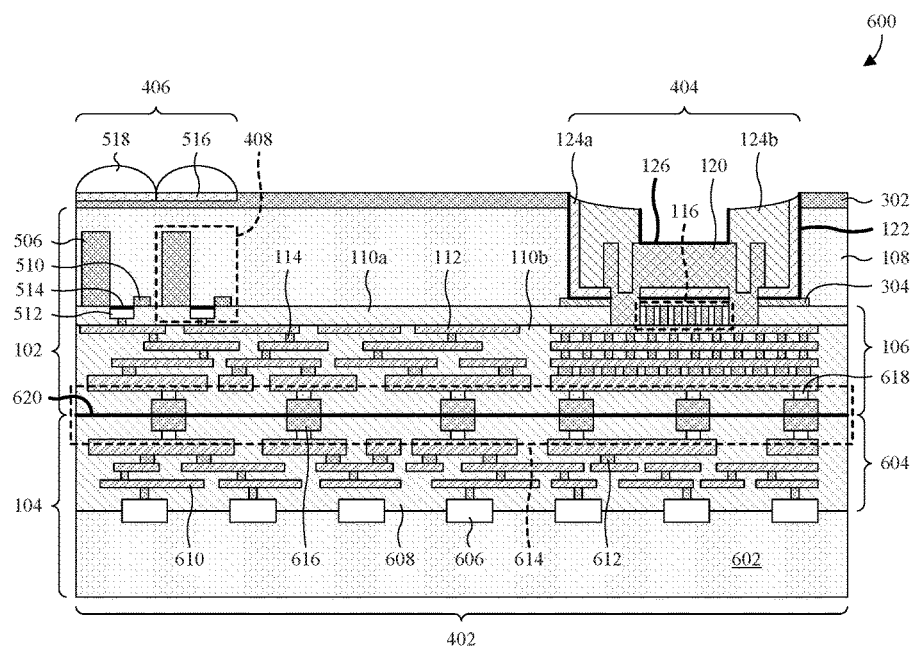
FIG. 6 illustrates a cross-sectional view of some more detailed embodiments of the BSI image sensor of FIG. 5.

With reference to FIG. 6, a cross-sectional view 600 of some more detailed embodiments of the BSI image sensor of FIG. 5 is provided. As illustrated, the support structure 104 is a second IC die, and comprises a second semiconductor substrate 602 and a second interconnect structure 604. The second semiconductor substrate 602 supports a plurality of semiconductor devices 606 and may be, for example, a bulk semiconductor substrate (e.g., a bulk silicon substrate) or some other semiconductor substrate. For ease of illustration, only one of the semiconductor devices 606 is labeled 606. The semiconductor devices 606 may be, for example, transistors, memory cells (e.g., flash memory cells), capacitors, some other semiconductor devices, or a combination of the foregoing.

The second interconnect structure 604 covers the semiconductor devices 606 and the second semiconductor substrate 602, and comprises an ILD layer 608, a plurality of wiring layers 610, and a plurality of vias 612. For ease of illustration, only one of the wiring layers 610 is labeled 610 and only one of the vias 612 is labeled 612. The wiring layers 610 and the vias 612 are conductive and are alternatingly stacked in the ILD layer 608. Further, the wiring layers 610 and the vias 612 electrically couple the semiconductor devices 606 to a hybrid bond (HB) structure 614 between the support structure 104 and the IC die 102.

The HB structure 614 secures and electrically couples the support structure 104 to the IC die 102, and comprises a pair of HB link layers 616 and a pair of HB vias 618. For ease of illustration, only one of the HB link layers 616 is labeled 616 and only one of the HB vias 618 is labeled 618. The HB link layers 616 are respectively in the interconnect structure 106 and the second interconnect structure 604, and contact along an interface 620 between the support structure 104 and the IC die 102. The HB vias 618 are respectively in the interconnect structure 106 and the second interconnect structure 604 and electrically couple the HB link layers 616 to the wiring layers 112, 610 in the respective interconnect structure 106, 604. The HB vias 618 and the HB link layers 616 are conductive and may be, for example, copper, aluminum copper, tungsten, or a combination of the foregoing.

While FIGS. 1, 3, 5, and 6 illustrate the pad 120 with a specific profile and/or a specific thickness, it is to be understood that this is just an example. The pad 120 may have other profiles, and/or other thicknesses, in other embodiments. Similarly, while FIGS. 1, 3, 5, and 6 illustrate the contact via array 116 with a specific profile, it is to be understood that this is just an example. The contact via array 116 may have other profiles in other embodiments.

With reference to FIGS. 7-21, a series of cross-sectional views 700-2100 of some embodiments of a method for manufacturing a BSI image sensor with a pad structure is provided. The BSI image sensor may, for example, be the BSI image sensor of FIGS. 4-6.

Figure 7:
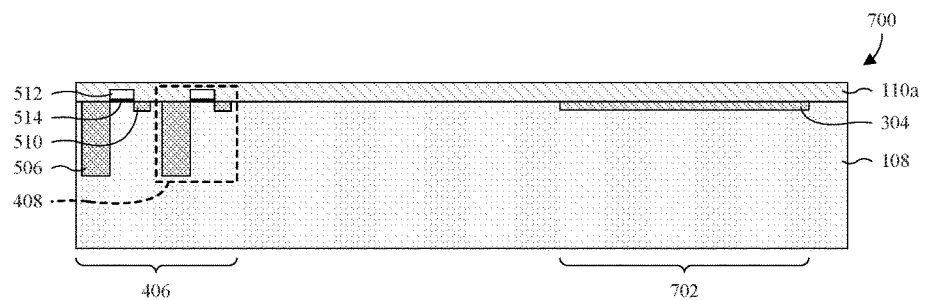
FIGS. 7-21 illustrate a series of cross-sectional views of some embodiments of a method for manufacturing a BSI image sensor with a pad structure.

As illustrated by the cross-sectional view 700 of FIG. 7, a pixel sensor array 406 (partially shown) is formed in a semiconductor substrate 108 and comprises a plurality of pixel sensors 408. For ease of illustration, only one of the pixel sensors 408 is labeled 408. Each of the pixel sensors 408 comprises a photodetector 506. Further, in some embodiments, each of the pixel sensors 408 comprises a FDN 510, a gate electrode 512, and a gate dielectric layer 514. The gate electrode 512 selectively couples the photodetector 506 electrically to the FDN 510, and the gate dielectric layer 514 spaces and electrically isolates the gate electrode 512 from the semiconductor substrate 108. Additionally, in some embodiments, an electrical-isolation region 304 is formed in a pad region 702 of the semiconductor substrate 108 that is laterally spaced from the pixel sensor array 406. The electrical-isolation region 304 may be, for example, an STI region, an implant isolation region, or a DTI region.

Also illustrated by the cross-sectional view 700 of FIG. 7, a first ILD layer 110a is formed covering the semiconductor substrate 108 and the pixel sensor array 406, and with a top surface that is planar. In some embodiments, the first ILD layer 110a is further formed covering the electrical-isolation region 304. The first ILD layer 110a may, for example, be formed of a silicon dioxide, a low κ dielectric, some other dielectric, or a combination of the foregoing. Further, the first ILD layer 110a may be formed by, for example, depositing or growing the first ILD layer 110a and subsequently performing a planarization into the top surface of the first ILD layer 110a. The depositing or growing may be performed by, for example, chemical or physical vapor deposition, sputtering, thermal oxidation, or some other growth or deposition process. The planarization may be performed by, for example, a chemical mechanical polish (CMP).

Figure 8:
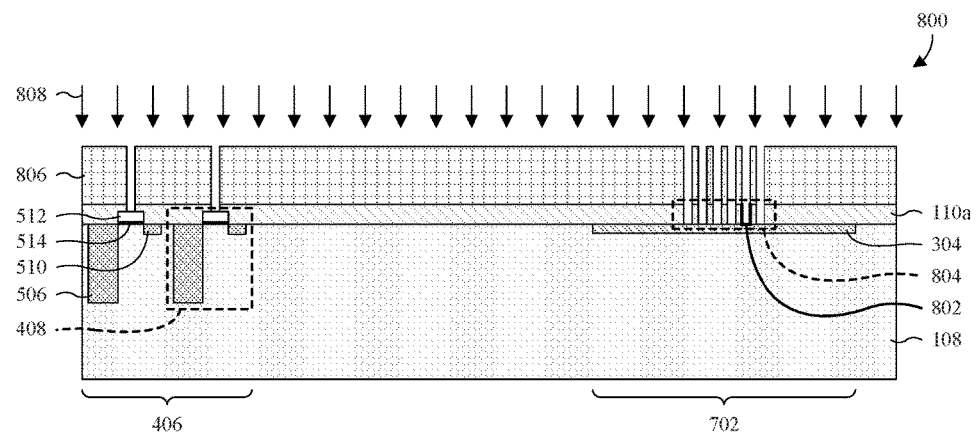

As illustrated by the cross-sectional view 800 of FIG. 8, a first etch is performed into the first ILD layer 110a to form contact via openings 802. For ease of illustration, only one of the contact via openings 802 is labeled 802. The contact via openings 802 comprise an array 804 of first openings that are arranged in rows and columns directly over the pad region 702 of the semiconductor substrate 108. The array of first openings may, for example, have the same layout as the contact via array 116 in one of FIGS. 2A-2D. Further, in some embodiments, the contact via openings 802 comprise second openings that expose gate electrodes 512 in the pixel sensor array 406.

In some embodiments, the process for performing the first etch comprises depositing a first photoresist layer 806 over the first ILD layer 110a, and patterning the first photoresist layer 806 using photolithography. An etchant 808 is then applied to the first ILD layer 110a with the first photoresist layer 806 in place until the contact via openings 802 are formed, and the first photoresist layer 806 is stripped. In some embodiments, the electrical-isolation region 304 and/or the gate electrodes 512 advantageously serve as an etch stop for the first etch.

Figure 9:
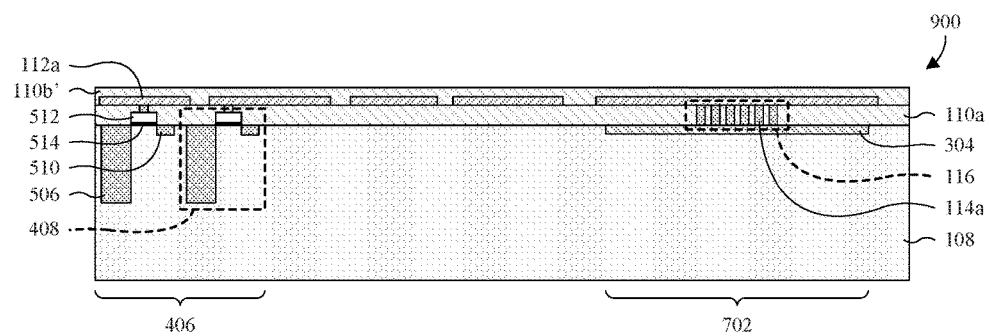

As illustrated by the cross-sectional view 900 of FIG. 9, a plurality of contact vias 114a is formed in the contact via openings 802 of FIG. 8, such that the contact vias 114a comprises a contact via array 116 directly over the pad region 702 of the semiconductor substrate 108. The contact via array 116 may, for example, be configured as described in one of FIGS. 2A-2D. In some embodiments, the process for forming the contact vias 114a comprises depositing or growing a conductive layer filling the contact via openings 802 of FIG. 8, and subsequently performing a planarization into the conductive layer to coplanarize a top surface of the conductive layer with a top surface of the first ILD layer 110a. The conductive layer and the contact vias 114a are formed of a conductive material, such as, for example, tungsten, copper, some other conductive material, or a combination of the foregoing, and/or may, for example, be formed by vapor deposition, sputtering, or electrochemical plating (ECP). The planarization may, for example, be performed by a CMP.

Advantageously, the contact via array 116 absorbs and releases bonding stress associated with a pad formed hereafter, such that the pad has high bond strength and a low likelihood of peeling. Further, by forming the contact via array 116 as described in FIGS. 8 and 9, the contact via array 116 may be formed without additional processes and/or additional masks. Namely, the contact via array 116 is formed simultaneously with the contact vias for gate electrodes 512 using a common reticle and a common process.

Also illustrated by the cross-sectional view 900 of FIG. 9, a first wiring layer 112a and a second ILD layer 110b' are formed covering the first ILD layer 110a and the contact vias 114a. The first wiring layer 112a may, for example, be formed of a conductive material, such as copper, aluminum copper, some other conductive material, or a combination of the foraging, and/or the second ILD layer 110b' may, for example, be formed of silicon dioxide, a low κ dielectric, some other dielectric, or a combination of the foregoing.

In some embodiments, the process for forming the first wiring layer 112a comprises depositing or growing the first wiring layer 112a covering the first ILD layer 110a and the contact vias 114a, and subsequently patterning first wiring layer 112a. The patterning may, for example, be performed using photolithography, and/or the depositing or growing may, for example, be performed by vapor deposition, sputtering, or ECP. Further, in some embodiments, the process for forming the second ILD layer 110b' comprises depositing or growing the second ILD layer 110b' covering the first ILD layer 110a and the first wiring layer 112a, and subsequently performing a planarization into a top surface of the second ILD layer 110b' so the top surface is planar. The planarization may, for example, be performed by a CMP, and/or the depositing or growing may, for example, be performed by vapor deposition, sputtering, or thermal oxidation.

Figure 10:
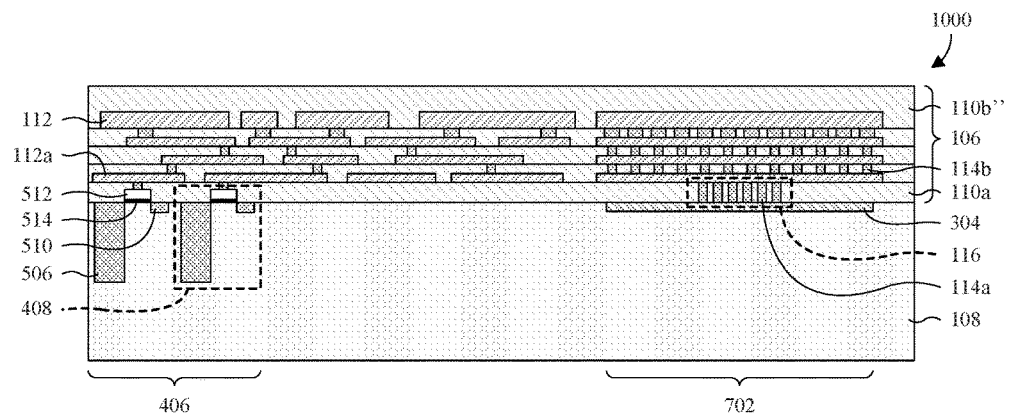

As illustrated by the cross-sectional view 1000 of FIG. 10, the first etch of FIG. 8, as well as the acts of FIG. 9, are repeated one more times to define an interconnect structure 106 covering the semiconductor substrate 108 and the pixel sensor array 406. In some embodiments, the interconnect structure 106 is further formed covering the electrical-isolation region 304. The interconnect structure 106 comprises the first ILD layer 110a as well as a plurality of second ILD layers 110b" stacked over the first ILD layer 110a. For ease of illustration, only one of the second ILD layers 110b" is labeled 110b". Further, the interconnect structure 106 comprises the contact vias 114a, a plurality of wiring layers 112, and a plurality of inter-wire vias 114b. For ease of illustration, only one of the wiring layers 112 is labeled 112 and only one of the inter-wire vias 114b is labeled 114b. The contact vias 114a are in the first ILD layer 110a, and the inter-wire vias 114b are in the second ILD layers 110b". Further, the inter-wire vias 114b are between the wiring layers 112.

Figure 11:
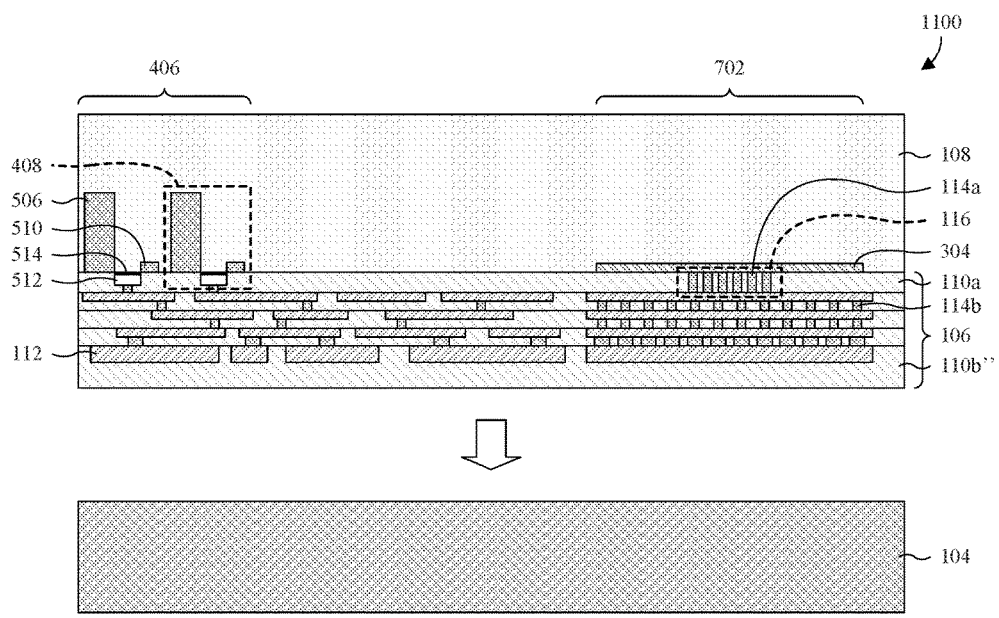

As illustrated by the cross-sectional view 1100 of FIG. 11, the semiconductor substrate 108 is bonded to a support structure 104 through the interconnect structure 106. In some embodiments, the support structure 104 is a bulk semiconductor substrate (e.g., a bulk silicon substrate), and/or the bonding is performed by direct of fusion bonding between the interconnect structure 106 and the support structure 104. In other embodiments, the support structure 104 is an IC die, and/or the bonding is performed by hybrid bonding a front side (i.e., an interconnect structure of the IC die) to the interconnect structure 106. An example of such embodiments of the support structure 104 is shown in FIG. 6.

Figure 12:
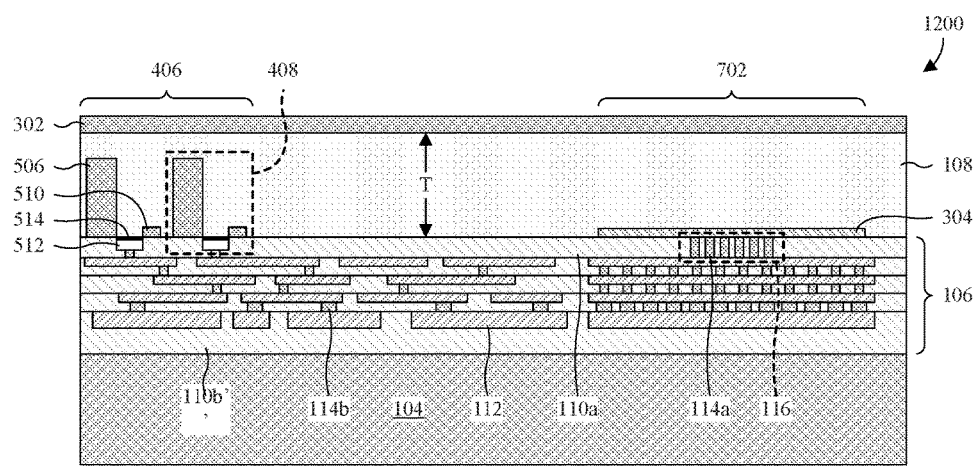

As illustrated by the cross-sectional view 1200 of FIG. 12, a passivation layer 302 is formed covering the semiconductor substrate 108 on an opposite side of the semiconductor substrate 108 as the interconnect structure 106. The passivation layer 302 may, for example, be formed of silicon dioxide, silicon nitride, some other dielectric, or a combination of the foregoing. Further, the passivation layer 302 may be formed by, for example, depositing or growing the passivation layer 302 on the semiconductor substrate 108. The depositing or growing may be performed by, for example, vapor deposition, sputtering, thermal oxidation, some other deposition or growth process, or a combination of the foregoing.

Also illustrated by the cross-sectional view 1200 of FIG. 12, in some embodiments, the semiconductor substrate 108 is thinned to a thickness T before forming the passivation layer 302. The thinning may, for example, be performed by a planarization, an etch back, some other thinning process, or a combination of the foregoing. The planarization may, for example, be performed by, for example, a CMP.

Figure 13:
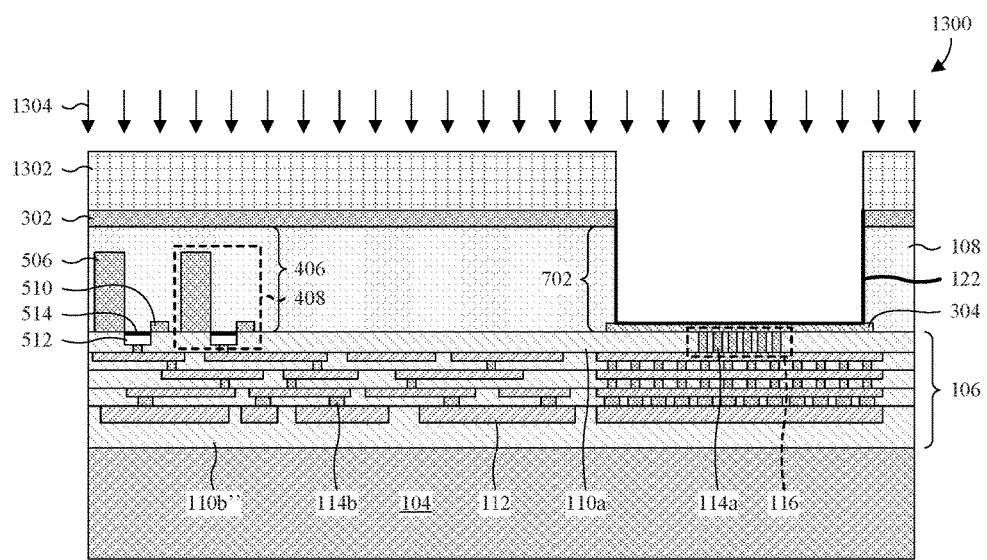

As illustrated by the cross-sectional view 1300 of FIG. 13, a second etch is performed into the passivation layer 302 and the semiconductor substrate 108 to form a first pad opening 122 in the pad region 702 of the semiconductor substrate 108. In some embodiments, the process for performing the second etch comprises depositing a second photoresist layer 1302 over the passivation layer 302, and subsequently patterning the passivation layer 302 using photolithography. An etchant 1304 is applied to the passivation layer 302 and the semiconductor substrate 108 with the second photoresist layer 1302 in place until the first pad opening 122 is formed, and the second photoresist layer 1302 is stripped. In some embodiments, the electrical-isolation region 304 advantageously serves as an etch stop for the second etch.

Figure 14:
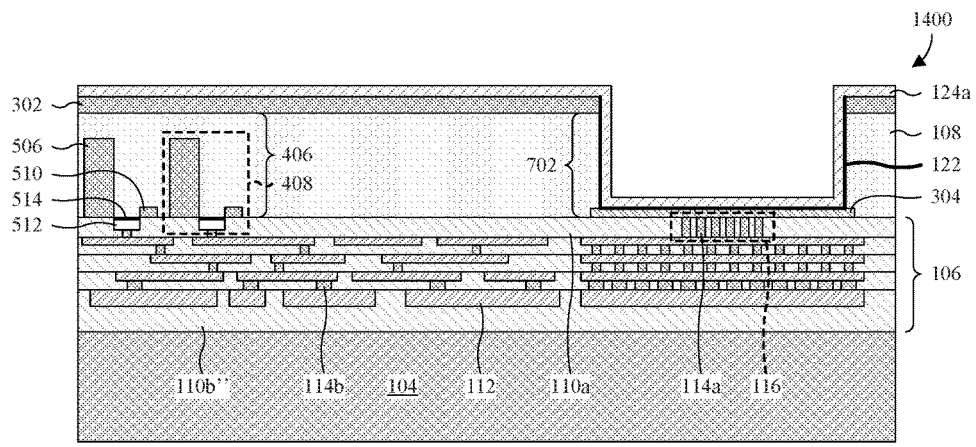

As illustrated by the cross-sectional view 1400 of FIG. 14, a liner dielectric layer 124a is formed lining the first pad opening 122, and further covering the passivation layer 302. Further, in some embodiments, the liner dielectric layer 124a is formed conformally. The liner dielectric layer 124a may, for example, be formed of silicon dioxide, silicon nitride, some other dielectric, or a combination of the foregoing. Further, the liner dielectric layer 124a may, for example, be formed by vapor deposition, sputtering, thermal oxidation, some other deposition or growth process, or a combination of the foregoing.

Figure 15:
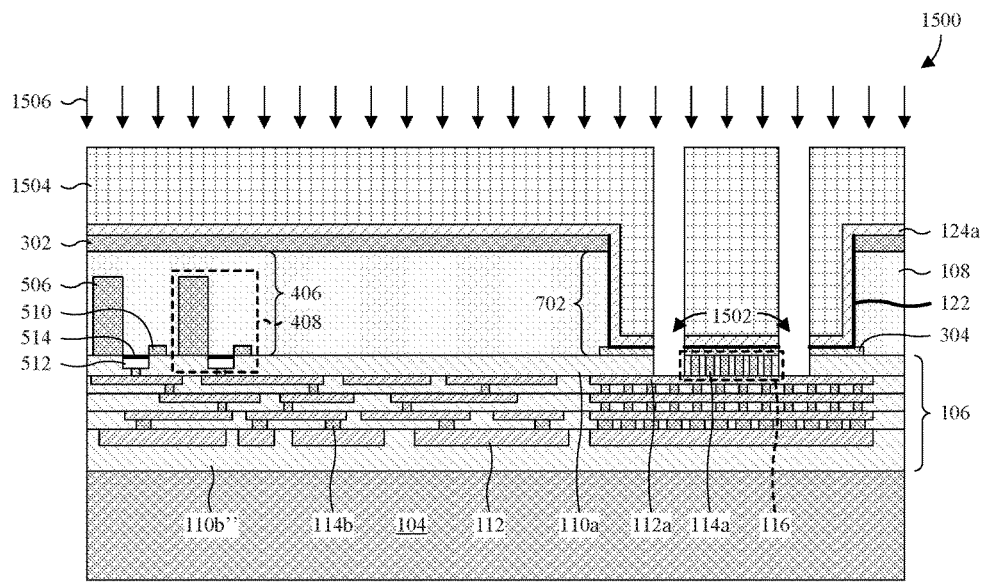

As illustrated by the cross-sectional view 1500 of FIG. 15, a third etch is performed into the liner dielectric layer 124a and the first ILD layer 110a, through the first pad opening 122, to form a pair of wiring openings 1502. In some embodiments, the third etch is further performed into the electrical-isolation region 304. The wiring openings 1502 are formed respectively on opposite sides of the contact via array 116 and expose a first wiring layer 112a of the interconnect structure 106 nearest the semiconductor substrate 108. In some embodiments, the process for performing the third etch comprises depositing a third photoresist layer 1504 over the liner dielectric layer 124a, and patterning the third photoresist layer 1504 using photolithography. An etchant 1506 is applied to the liner dielectric layer 124a and the first ILD layer 110a with the third photoresist layer 1504 in place until the wiring openings 1502 are formed, and the third photoresist layer 1504 is stripped. In some embodiments, the first wiring layer 112a advantageously serves as an etch stop for the third etch.

Figure 16:
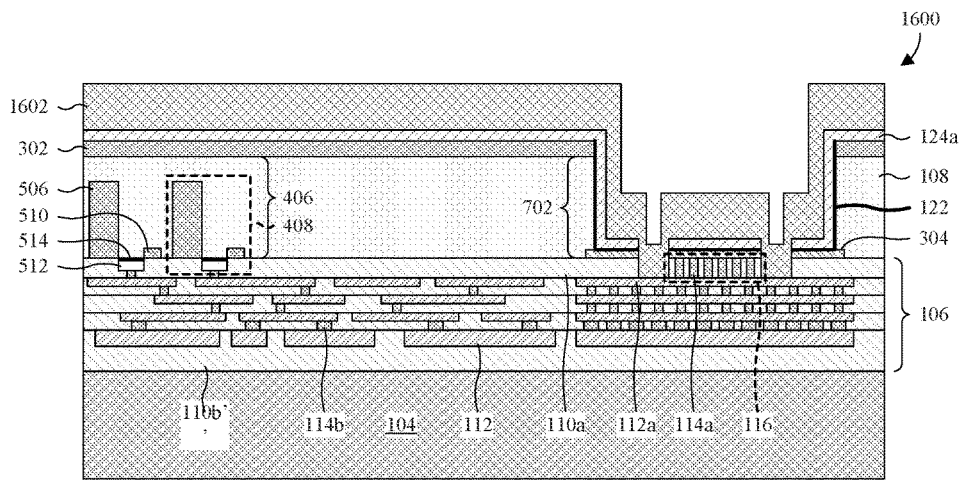

As illustrated by the cross-sectional view 1600 of FIG. 16, a pad layer 1602 is formed lining the first pad opening 122 over the liner dielectric layer 124a, lining the wiring openings 1502 of FIG. 15, and further covering the liner dielectric layer 124a outside the first pad opening 122. Further, in some embodiments, the pad layer 1602 is formed conformally. The pad layer 1602 is formed of a conductive material, such as, for example, copper, aluminum copper, some other conductive material, or a combination of the foregoing. Further, in some embodiments, the pad layer 1602 is formed by vapor deposition, sputtering, ECP, some other deposition or growth process, or a combination of the foregoing.

Figure 17:
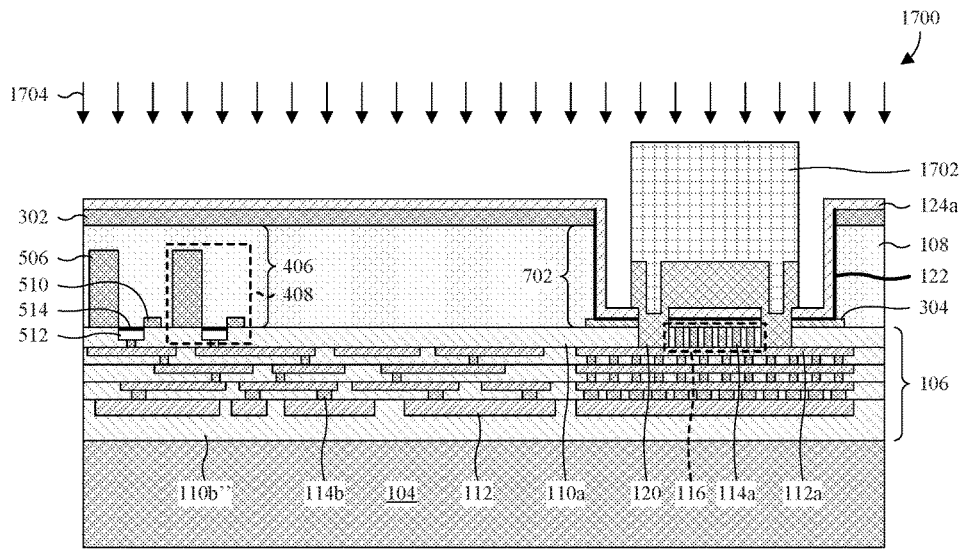

As illustrated by the cross-sectional view 1700 of FIG. 17, a fourth etch is performed into the pad layer 1602 of FIG. 16 to form a pad 120 from the pad layer 1602. The pad 120 is formed in the first pad opening 122, and extends through the liner dielectric layer 124a and the first ILD layer 110a to contact the first wiring layer 112a on opposite sides of the contact via array 116. As noted above, the contact via array 116 advantageously absorbs bond stress associated with the pad 120, such that the pad 120 has high bond strength and a low liklehood of peeling. In some embodiments, the process for performing the fourth etch comprises depositing a fourth photoresist layer 1702 over the pad layer 1602, and patterning the fourth photoresist layer 1702 using photolithography. An etchant 1704 is applied to the pad layer 1602 with the fourth photoresist layer 1702 in place until the pad 120 is formed, and the fourth photoresist layer 1702 is stripped. In some embodiments, the liner dielectric layer 124a advantageously serves as an etch stop for the fourth etch.

Figure 18:
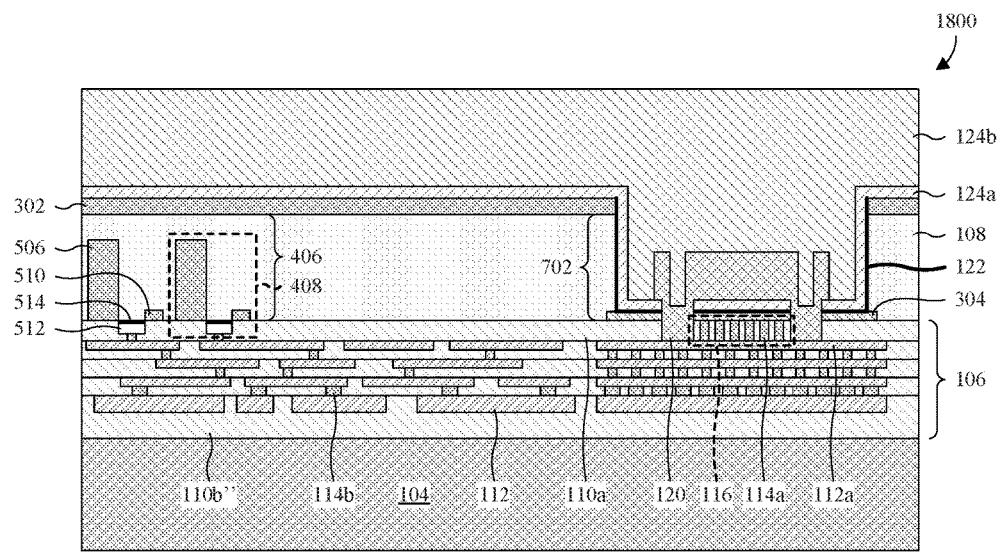

As illustrated by the cross-sectional view 1800 of FIG. 18, a filler dielectric layer 124b is formed filling the first pad opening 122 over the pad 120 and the liner dielectric layer 124a. In some embodiments, the filler dielectric layer 124b is formed of silicon dioxide, silicon nitride, some other dielectric, or a combination of the foregoing. Further, in some embodiments, the filler dielectric layer 124b is formed by vapor deposition, sputtering, thermal oxidation, some other deposition or growth process, or a combination of the foregoing.

Figure 19:
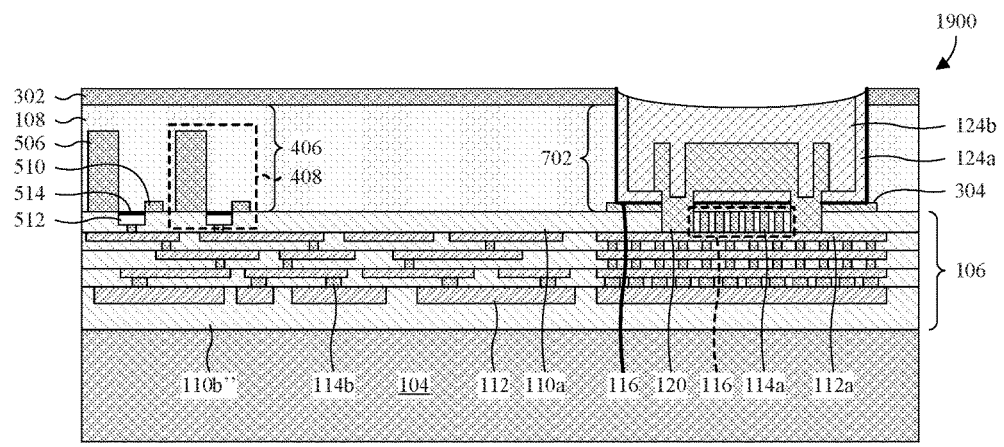

As illustrated by the cross-sectional view 1900 of FIG. 19, a planarization and/or a fifth etch are performed into the filler dielectric layer 124b and the liner dielectric layer 124a to recess top surfaces respectively of the filler dielectric layer 124b and the liner dielectric layer 124a to below a top surface of the passivation layer 302 and/or a top surface of the semiconductor substrate 108. The planarization may, for example, be performed by a CMP. In some embodiments, a fifth etch is performed selectively into the filler dielectric layer 124b to remove some of the filler dielectric layer 124b over the passivation layer 302, and a CMP planarization is subsequently performed into the filler dielectric layer 124*b* and the liner dielectric layer 124*a*. Such embodiments advantageously reduce loading on a polishing head used to perform the CMP planarization.

Figure 20:
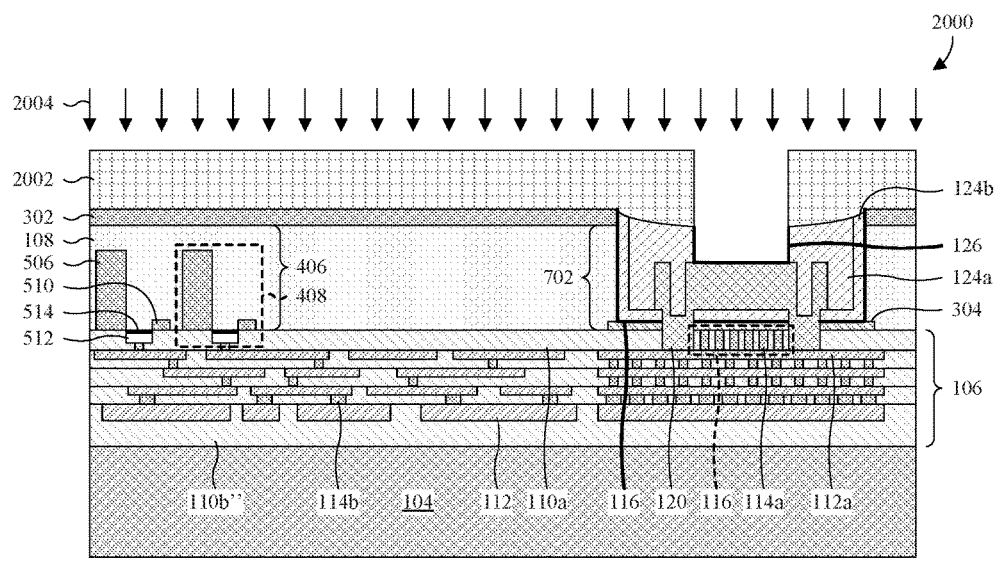

As illustrated by the cross-sectional view 2000 of FIG. 20, a sixth etch is performed into the filler dielectric layer 124*b* to form a second pad opening 126 exposing the pad 120. In some embodiments, the process for performing the sixth etch comprises depositing a sixth photoresist layer 2002 over the filler dielectric layer 124*b* and the passivation layer 302, and patterning the sixth photoresist layer 2002 using photolithography. An etchant 2004 is applied to the filler dielectric layer 124*b* with the sixth photoresist layer 2002 in place until the second pad opening 126 is formed, and the sixth photoresist layer 2002 is stripped. In some embodiments, the pad 120 advantageously serves as an etch stop for the sixth etch.

Figure 21:
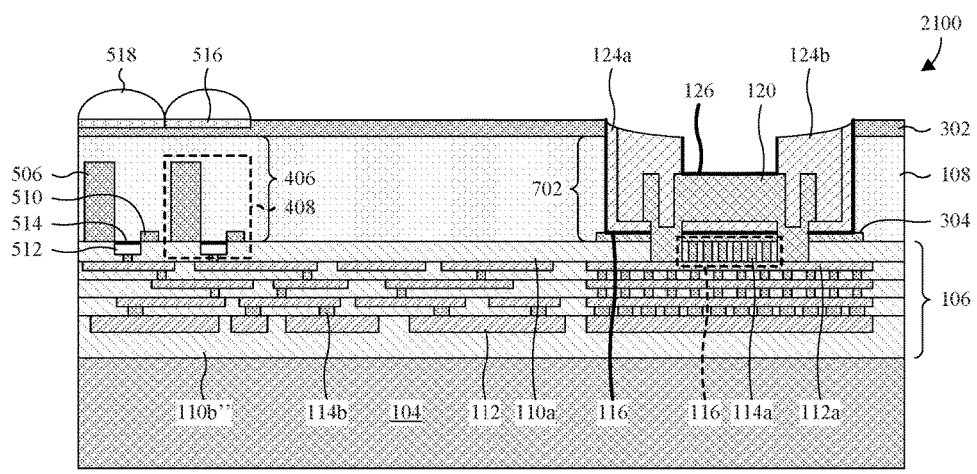

As illustrated by the cross-sectional view 2100 of FIG. 21, color filters 516 are formed in the passivation layer 302, respectively covering the pixel sensors 408. Further, microlenses 518 are formed respectively covering the color filters 516.

Figure 22:
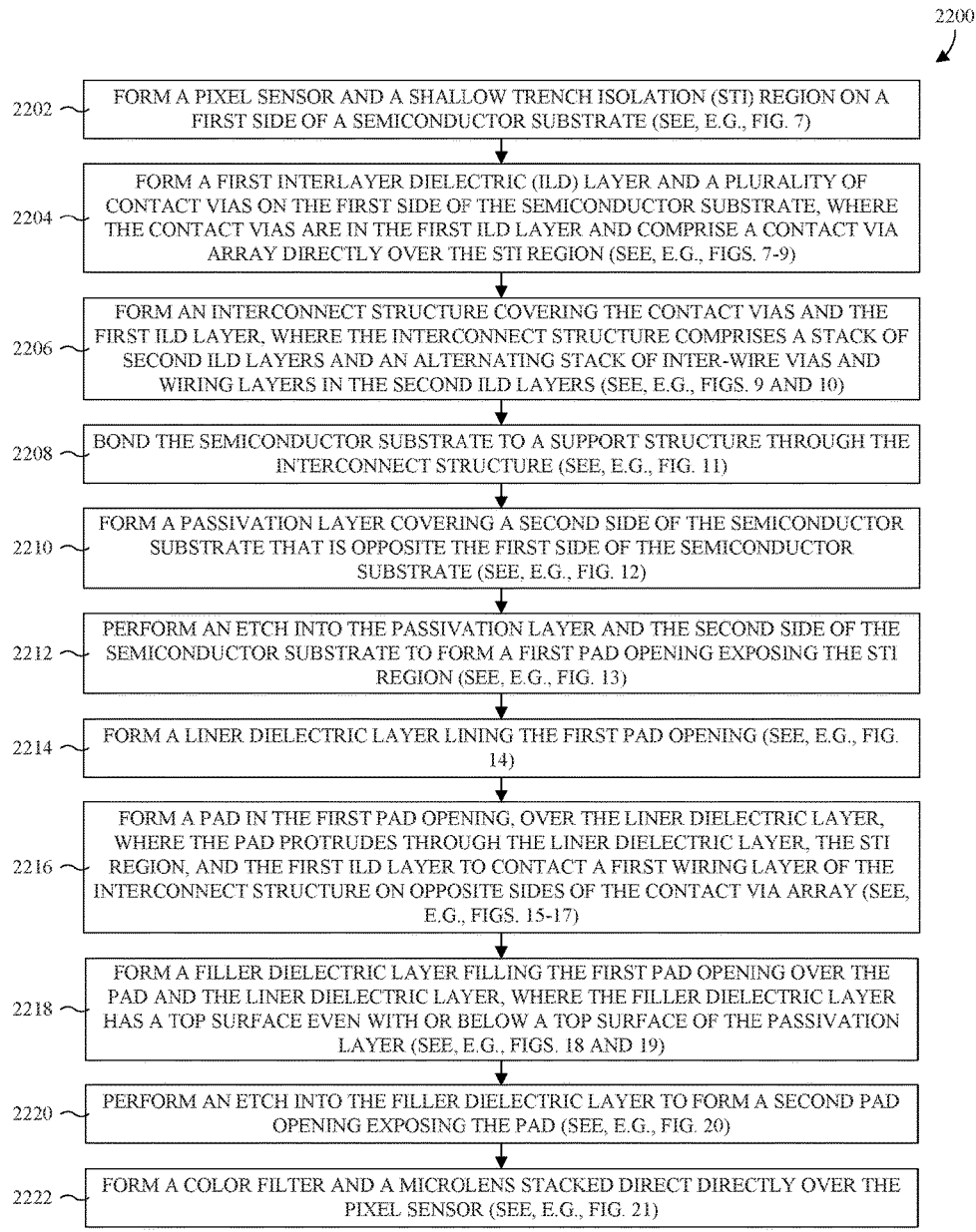
FIG. 22 illustrates a flowchart of some embodiments of the method of FIGS. 7-21.

With reference to FIG. 22, a flowchart 2200 of some embodiments of the method of FIGS. 7-21 is provided.

At 2202, a pixel sensor and a STI region are formed on a first side of a semiconductor substrate. See, for example, FIG. 7.

At 2204, a first ILD layer and a plurality of contact vias are formed on the first side of the semiconductor substrate, where the contact vias are in the first ILD layer and comprise a contact via array directly over the STI region. See, for example, FIGS. 7-9. The contact via array advantageously absorbs bond stress associated with a pad formed hereafter.

At 2206, an interconnect structure is formed covering the contact vias and the first ILD layer, where the interconnect structure comprises a stack of second ILD layers and an alternating stack of inter-wire vias and wiring layers in the second ILD layers. See, for example, FIGS. 9 and 10.

At 2208, the semiconductor substrate is bonded to a support structure through the interconnect structure. See, for example, FIG. 11.

At 2210, a passivation layer is formed covering a second side of the semiconductor substrate that is opposite the first side of the semiconductor substrate. See, for example, FIG. 12.

At 2212, an etch is performed into the passivation layer and the second side of the semiconductor substrate to form a first pad opening exposing the STI region. See, for example, FIG. 13.

At 2214, a liner dielectric layer is formed lining the first pad opening. See, for example, FIG. 14.

At 2216, a pad is formed in the first pad opening, over the liner dielectric layer, where the pad protrudes through the liner dielectric layer, the STI region, and the first ILD layer to contact a first wiring layer of the interconnect structure on opposite sides of the contact via array. See, for example, FIGS. 15-17.

At 2218, a filler dielectric layer is formed filling the first pad opening over the pad and the liner dielectric layer, where the filler dielectric layer has a top surface even with or below a top surface of the passivation layer. See, for example, FIGS. 18 and 19.

At 2220, an etch is performed into the filler dielectric layer to form a second pad opening exposing the pad. See, for example, FIG. 20.

At 2222, a color filter and a microlens are formed stacked direct directly over the pixel sensor. See, for example, FIG. 21.

While the flowchart 2200 of FIG. 22 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In view of the foregoing, some embodiments of the present application provides a pad structure. A semiconductor substrate comprises a pad opening. An interconnect structure is under the semiconductor substrate, and comprises an ILD layer, a wiring layer, and a contact via array. The wiring layer and the contact via array are in the ILD Layer, and the contact via array is directly under the pad opening, between the wiring layer and the semiconductor substrate. A pad covers the contact via array in the pad opening, and protrudes into the ILD layer to contact the ILD layer and the wiring layer.

Further, other embodiments of the present application provide a method for manufacturing a pad structure. An ILD layer is formed on a first side of a semiconductor substrate. A contact via array is formed in the ILD layer. An interconnect structure is formed covering the contact via array and the ILD layer on the first side of a semiconductor substrate. The interconnect structure comprises a wiring layer bordering and electrically coupled to the contact via array. An etch is performed into a second side of the semiconductor substrate, opposite the first side, to form a pad opening covering the contact via array. A pad is formed covering the contact via array in the pad opening, and protrudes into the ILD layer to contact the ILD layer and the wiring layer.

Further yet, other embodiments of the present application provide an image sensor. A semiconductor substrate comprises a pad opening. An APS is on an underside of the semiconductor substrate, laterally spaced from the pad opening. The APS comprises a photodetector arranged in the semiconductor substrate, and further comprises a gate electrode spaced below the semiconductor substrate and bordering the photodetector. An interconnect structure is under the semiconductor substrate and the APS. The interconnect structure comprises a ILD layer, a wiring layer, and a plurality of contact vias. The wiring layer and the contact vias are in the ILD layer, and the contact vias are between the wiring layer and the semiconductor substrate. Further, the contact vias comprises a first contact via and a dummy contact via array, and the first contact via contacts the wiring layer and the gate electrode. A pad covers the dummy contact via array in the pad opening, and the pad protrudes into the ILD layer to contact the ILD layer and the wiring layer. A pad dielectric layer fills the pad opening around the pad, and laterally spaces sidewalls of the pad from sidewalls of the pad opening. Further, the pad dielectric layer covers the pad and is partially covered by the pad.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A pad structure comprising:
a semiconductor substrate comprising a pad opening;
an interconnect structure under the semiconductor substrate, wherein the interconnect structure comprises an interlayer dielectric (ILD) layer, a wiring layer, and a contact via array, wherein the wiring layer and the contact via array are in the ILD Layer; and
a pad covering the contact via array in the pad opening, wherein the pad protrudes into the ILD layer to contact the ILD layer and a continuous segment of the wiring layer, and wherein the contact via array is directly between the pad and the continuous segment of the wiring layer.

2. The pad structure according to claim 1, wherein the pad comprises a pair of pad segments, wherein the pad segments are respectively on opposite sides of the contact via array, and wherein the pad segments each protrudes into the ILD layer to contact the ILD layer and the wiring layer.

3. The pad structure according to claim 1, wherein the contact via array comprises a plurality of contact vias arranged in a plurality of rows and a plurality of columns, and wherein the contact vias share a common footprint.

4. The pad structure according to claim 3, wherein the contact vias are island-type vias each having a length and width that are substantially the same.

5. The pad structure according to claim 1, wherein the contact via array comprises a plurality of contact vias arranged in a plurality of rows and a single column, or a plurality of columns and a single row, and wherein the contact vias are slot-type vias that are laterally elongated and that each have a length greater than that of the pad.

6. The pad structure according to claim 1, wherein the contact via array comprises a plurality of island-type vias and a plurality of slot-type vias arranged in a plurality of rows and a plurality of columns.

7. The pad structure according to claim 6, wherein the contact via array alternates between the island-type vias and the slot-type vias along a first axis, and wherein the slot-type vias span multiple rows or columns along a second axis orthogonal to the first axis.

8. The pad structure according to claim 7, wherein the contact via array alternates between the island-type vias and the slot-type vias along the second axis.

9. The pad structure according to claim 1, wherein the interconnect structure comprises a plurality of wiring layers and a plurality of vias alternatingly stacked in the ILD layer, wherein the plurality of wiring layers comprises the wiring layer, and wherein the plurality of vias comprise the contact via array.

10. The pad structure according to claim 1, further comprising:
a shallow trench isolation (STI) region in the semiconductor substrate, directly between the contact via array and the pad, wherein the pad protrudes through the STI region, and wherein the STI region contacts semiconductor sidewalls of the semiconductor substrate.

11. The pad structure according to claim 1, further comprising:
a pad dielectric layer filling the pad opening around the pad, wherein the pad dielectric layer laterally spaces the pad from sidewalls of the pad opening that are defined by the semiconductor substrate, wherein the pad dielectric layer partially covers the pad and is partially covered by the pad, and wherein the pad dielectric layer comprises a second pad opening exposing a top surface of the pad.

12. An image sensor comprising:
a semiconductor substrate comprising a pad opening;
an active pixel sensor (APS) on an underside of the semiconductor substrate, laterally spaced from the pad opening, wherein the APS comprises a photodetector arranged in the semiconductor substrate, and further comprises a gate electrode spaced below the semiconductor substrate and bordering the photodetector;
an interconnect structure under the semiconductor substrate and the APS, wherein the interconnect structure comprises an interlayer dielectric (ILD) layer, a wiring layer, and a plurality of contact vias, wherein the wiring layer and the plurality of contact vias are in the ILD layer, wherein the plurality of contact vias are between the wiring layer and the semiconductor substrate, wherein the plurality of contact vias comprise a first contact via and a dummy contact via array, and wherein the first contact via contacts the wiring layer and the gate electrode;
a pad covering the dummy contact via array in the pad opening, wherein the pad protrudes into the ILD layer to contact the ILD layer and the wiring layer; and
a pad dielectric layer filling the pad opening around the pad, wherein the pad dielectric layer covers the pad and is partially covered by the pad, and wherein the pad dielectric layer laterally spaces sidewalls of the pad from sidewalls of the pad opening.

13. The image sensor according to claim 12, wherein the dummy contact via array comprises a plurality of dummy contact vias arranged in a plurality of rows and a plurality of columns, and wherein the plurality of dummy contact vias share a common footprint.

14. The image sensor according to claim 13, wherein the plurality of dummy contact vias are island-type vias each having a length and width that are substantially the same.

15. The image sensor according to claim 12, wherein the dummy contact via array comprises a plurality of dummy contact vias arranged in a plurality or rows and a single column, or a plurality of columns and a single row, and wherein the plurality of dummy contact vias are slot-type vias that are laterally elongated.

16. The image sensor according to claim 12, wherein the dummy contact via array comprises a plurality of island-type vias and a plurality of slot-type vias arranged in a plurality of rows and a plurality of columns.

17. The image sensor according to claim 16, wherein the contact via array alternates between the island-type vias and the slot-type vias along a first axis, and wherein the slot-type vias span multiple rows or columns along a second axis orthogonal to the first axis.

18. An integrated circuit (IC) comprising:
an interconnect structure comprising an interlayer dielectric (ILD) layer, a plurality of wires, and a plurality of vias, wherein the wires and the vias are alternatingly stacked in the ILD layer, wherein the wires comprise a top wire, wherein the vias comprise a plurality of dummy vias defining a dummy via array, and wherein the dummy via array overlies and directly contacts the top wire;
a semiconductor substrate overlying the interconnect structure;

a pad dielectric layer overlying the top wire and the dummy via array, wherein the pad dielectric layer extends through the semiconductor substrate, from a top of the semiconductor substrate to a bottom of the semiconductor substrate, and directly contacts the ILD layer at an inter-dielectric interface; and a pad structure overlying the dummy via array and spaced from the semiconductor substrate by the pad dielectric layer, wherein the pad structure comprises a pair of segments respectively on opposite sides of the dummy via array, and wherein the segments extend from over the inter-dielectric interface to direct contact with the top wire under the inter-dielectric interface.

19. The IC according to claim 18, wherein the pad dielectric layer defines a pad opening overlying and exposing a top surface of the pad structure.

20. The IC according to claim 18, wherein the pad dielectric layer underlies a bulk of the pad structure and spaces the bulk of the pad structure over the inter-dielectric interface, and wherein the segments of the pad structure extend from the bulk of the pad structure to the top wire.

* * * * *